United States Patent [19]
Nakaizumi

[11] Patent Number: 6,031,382
[45] Date of Patent: Feb. 29, 2000

[54] FUNCTIONAL TESTER FOR INTEGRATED CIRCUITS

[75] Inventor: Kazuo Nakaizumi, Tokyo, Japan

[73] Assignee: NEC Corporation, Tokyo, Japan

[21] Appl. No.: 08/544,582

[22] Filed: Oct. 18, 1995

[30] Foreign Application Priority Data

Oct. 31, 1994 [JP] Japan .................................. 6-267645

[51] Int. Cl.[7] .................................................. G01R 31/02
[52] U.S. Cl. .......................................... 324/754; 324/765
[58] Field of Search ............................... 324/73.1, 158.1,
324/763, 754, 765, 537; 437/8; 257/40,
48; 371/22.1, 15.1; 438/14, 17

[56] References Cited

U.S. PATENT DOCUMENTS

| | | | |
|---|---|---|---|
| 5,020,219 | 6/1991 | Leedy | 29/846 |
| 5,023,545 | 6/1991 | Marqués | 324/754 |
| 5,177,439 | 1/1993 | Liu et al. | 324/754 |
| 5,206,582 | 4/1993 | Ekstedt et al. | 324/73.1 |
| 5,420,520 | 5/1995 | Anschel et al. | 324/754 |

FOREIGN PATENT DOCUMENTS

| | | |
|---|---|---|
| 62-243335 | 10/1987 | Japan . |
| 2-56947 | 2/1990 | Japan . |
| 2-239641 | 9/1990 | Japan . |

*Primary Examiner*—Vinh P. Nguyen
*Attorney, Agent, or Firm*—Sughrue, Mion, Zinn, Macpeak & Seas, PLLC

[57] ABSTRACT

A tester for integrated circuits, includes a testing set for supplying inputs for operating an integrated circuit to be tested and for measuring outputs of the integrated circuit to be tested, a semiconductor chip or wafer formed with at least some of the functions of the testing set, and a contact member through which the semiconductor chip or wafer is to come into electrical contact with the integrated circuit to be tested. Thus, it is not necessary to transmit test signals from the testing set, and hence it is possible to simplify the expensive hardware necessary for transmitting the test signals. As a result, the cost of the tester is markedly reduced.

15 Claims, 4 Drawing Sheets

FUNCTIONAL TESTER FOR INTEGRATED CIRCUITS

BACKGROUND OF THE INVENTION

1. Field of the Invention

The invention relates to a tester for testing an integrated circuit comprising a single chip or a wafer having a plurality of chips formed thereon to determine whether the integrated circuit properly operates or not.

2. Description of the Related Art

In a conventional integrated circuit tester for testing a semiconductor chip or an integrated circuit formed on a wafer, an LSI tester supplies a current, clock, address and input/output data in number equal to the number of chips and input/outputs to a chip or a wafer to be tested, and evaluates outputs of that chip or a wafer by means of an evaluation circuit. Hereinbelow will be explained a memory tester for testing a memory, as an example of an LSI tester.

With reference to FIG. 1, a conventional memory tester includes a main frame 51 and a station 52 for measurement. The measurement station 52 is provided with a measurement board 53 having a plurality of receptacles to which memories 54 to be tested are inserted for measurement.

FIG. 2 is a block diagram of the memory tester illustrated in FIG. 1. The main frame 51 of the memory tester includes a central processing unit (CPU) 61 therein, and the measurement station 52 includes a plurality of driver comparators 62. Each of the memories 54 to be tested is in electrical connection with each of the driver comparators 62 through signal lines 64, 65 and 66. Each of the driver comparators 62 supplies highly accurate and high-speed clocks as RAS signals and CAS signals to the memories 54 to be tested through the signal lines 64 and 65, and receives output data through the signal line 66. Each of the driver comparators 62 also highly accurately evaluates output data transmitted from each of the memories 54 through the signal line 66.

An LSI tester has been suggested in many publications such as Japanese Unexamined Patent Public Disclosures Nos. 62-243335, 2-239641 and 2-56947 which is based on U.S. application Ser. No. 195,667 filed on May 18, 1988 and assigned to Hewlett Packard. In addition, it is also known to provide a chip or wafer to be tested with a circuit for testing in order to test an LSI.

However, since it is necessary in a conventional LSI tester to supply and receive clocks, addresses, data and so on with high accuracy and high speed in accordance with the number of chips and input/outputs of an integrated circuit to be tested, such testers are expensive. For instance, a memory tester which can test 16 16M-DRAMs of 8 bits in parallel at 100 MHz presently costs about two million dollars.

SUMMARY OF THE INVENTION

In view of the foregoing problems, it is an object of the present invention to provide an integrated circuit tester capable of highly accurately testing a chip or an integrated circuit formed on a wafer with a smaller number of hardware components.

The invention provides a tester for integrated circuits, including (a) a testing set for supplying inputs for operating an integrated circuit to be tested to and for measuring outputs of the integrated circuit to be tested, and (b) a semiconductor chip or wafer arranged to be in direct contact with the integrated circuit to be tested, the semiconductor chip or wafer being formed with at least a part of the testing set.

The invention further provides a tester for integrated circuits, including (a) a testing set for supplying inputs for operating an integrated circuit and for measuring outputs of the integrated circuit to be tested, (b) a semiconductor chip or wafer formed with at least a part of the testing set, and (c) a contact member through which the semiconductor chip or wafer is to come into electrical contact with the integrated circuit to be tested.

Hereinbelow a silicon semiconductor is used as an example, and thus a semiconductor chip or a semiconductor wafer formed with at least a part of the testing set is referred to as a silicon tester chip or a silicon tester wafer, respectively.

In the integrated circuit tester in accordance with the invention, some or all of the functions of an LSI tester are formed in a semiconductor chip or a semiconductor wafer to thereby make the chip or wafer serve as a silicon tester. The silicon tester is in electrical contact with an integrated circuit to be tested through the contact member. Thus, it is no longer necessary to transmit all signals necessary for testing from an LSI tester through signal lines. In particular, since the functions of a highly accurate high-speed driver and comparator for use with multi input/outputs are established in the silicon tester, the hardware of the LSI tester is remarkably simplified.

In addition, since the silicon tester and an integrated circuit to be tested are either in direct contact with each other or in contact with each other only through the contact member, it is no longer necessary to arrange long signal lines. Accordingly, an expensive driver is not necessary for the silicon tester. Thus, the cost of the tester as a whole can be much reduced.

For instance, a conventional memory tester which can test 16 16M-DRAMs of 8 bits in parallel at 100 MHz needs 138 driver boards, and thus costs about two million dollars. On the other hand, in accordance with the invention, the silicon tester has the functions of a driver and a comparator, and hence the main frame of the LSI tester is required to have is just a single 1 bit piece of hardware. In addition, the main frame of this LSI tester can operate at 25 MHz. In an LSI tester in accordance with the invention, only 22 driver boards are necessary, which is one-sixth or less the number of driver boards required by a conventional LSI tester. In addition, standard docks can be retarded. Thus, it is now possible to carry out the same test by using a memory tester of about five hundred thousand dollars as a test carried out by a conventional tester.

The silicon tester can be fabricated by almost the same process as a 16M-DRAM. If there is fabricated a silicon tester which can test 16 16M-DRAMs of 8 bits in parallel at 100 MHz, the silicon tester would cost one hundred and fifty thousand dollars or less. Accordingly, the total price of the memory tester and the silicon tester is about six hundred and fifty thousand dollars, which is one third of or smaller than the price of the above mentioned conventional memory tester.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 1:
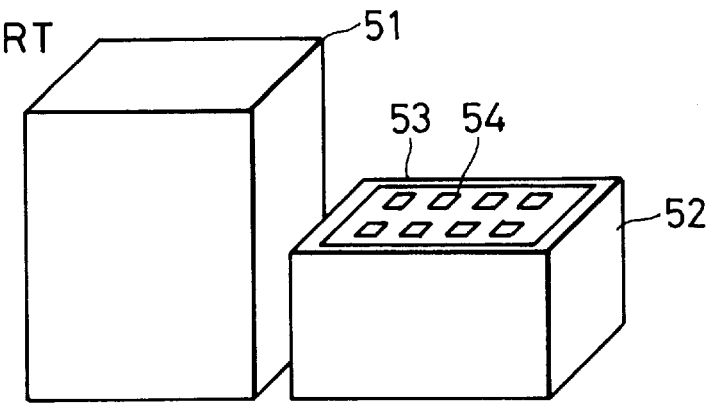
FIG. 1 is a perspective view of a conventional memory tester.
Figure 2:
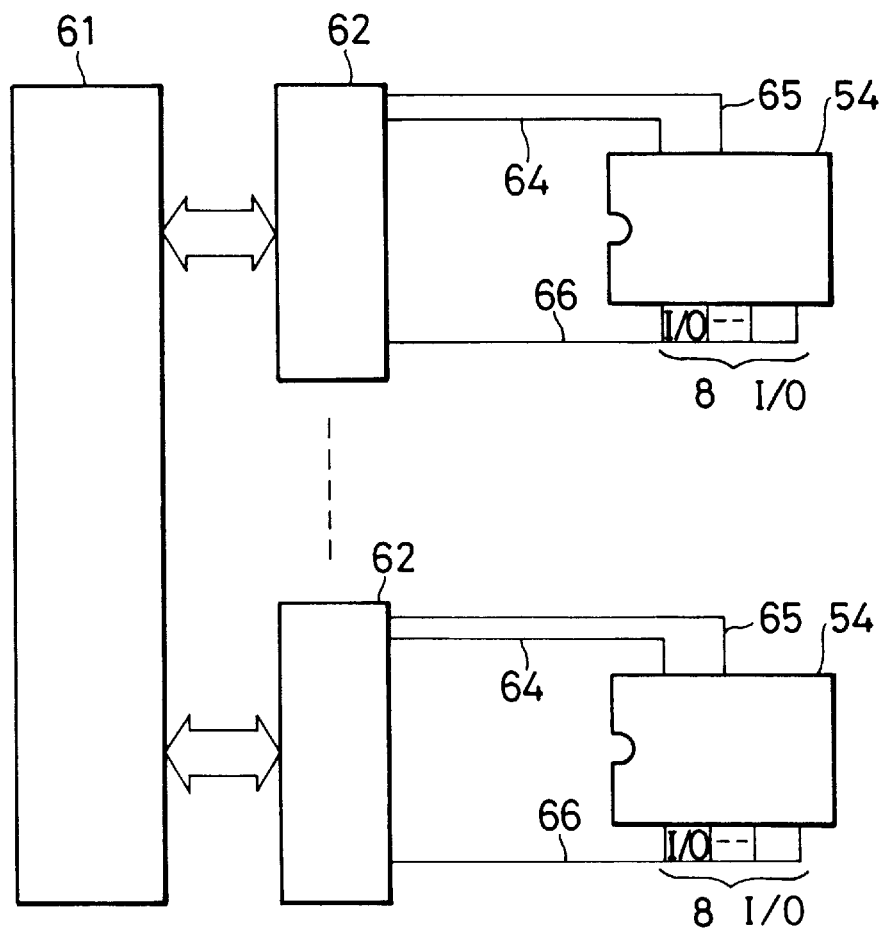
FIG. 2 is a block diagram of the memory tester illustrated in FIG. 1.
Figure 3:
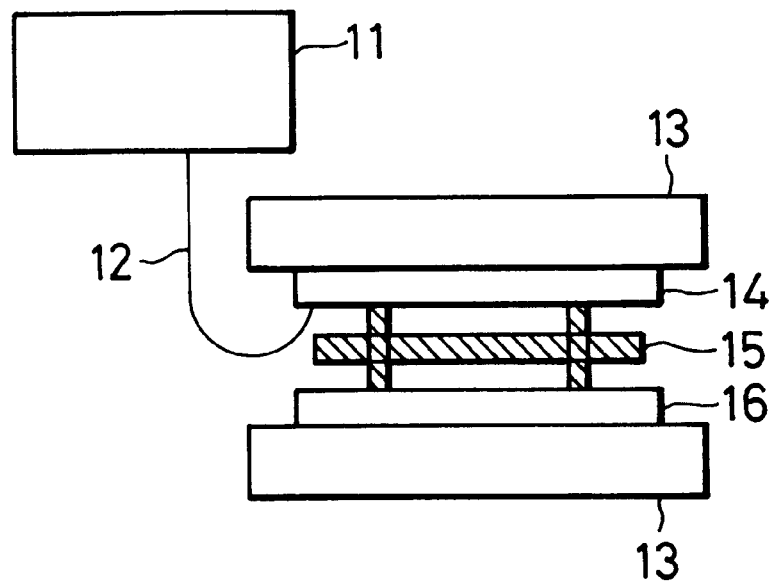
FIG. 3 is a schematic view illustrating an integrated circuit tester in accordance with the first embodiment of the present invention.

With reference to FIG. 3, an integrated circuit tester in accordance with the first embodiment is for testing a 16M-DRAM chip built in a multi chip module (MCM). The illustrated tester supplies to a chip 16 to be tested necessary inputs such as a current and a signal for operating circuits of the chip 16, and receives outputs from the chip 16. The tester comprises a memory tester 11, a silicon tester chip 14, and a signal line cable 12 electrically connecting the memory tester 11 to the silicon tester chip 14. Each of the silicon tester. chip 14 and the chip 16 is attached to a glass 13, and they are in electrical connection with each other through a contact member 15 made of piezoelectric conductive rubber (PCR). The silicon tester chip 14 has a part or all of the functions necessary for testing the chip 16.

Figure 4:
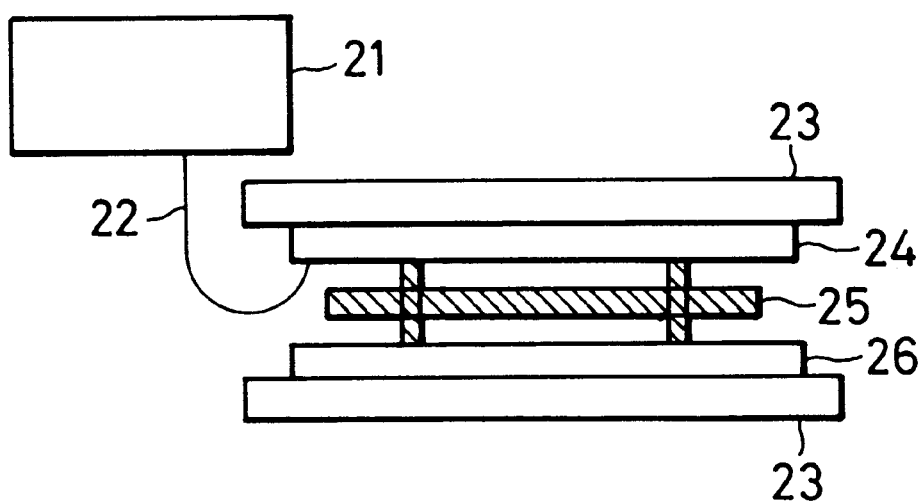
FIG. 4 is a schematic view illustrating an integrated circuit tester in accordance with the second embodiment of the present invention.

With reference to FIG. 4, an integrated circuit tester in accordance with the second embodiment is for testing a wafer. The illustrated tester supplies to a 5 wafer 26 to be tested necessary inputs such as a current and a signal for operating the wafer 26, and receives outputs from the wafer 26. The tester comprises a memory tester 21, a silicon tester wafer 24, and a signal line cable 22 electrically connecting the memory tester 21 to the silicon tester wafer 24. Each of the silicon tester wafer 24 and the wafer 26 is attached to a glass 23, and they are in electrical connection with each other through a contact member 25 made of piezoelectric conductive rubber (PCR). The silicon tester wafer 24 has a part or all of the functions necessary for testing the wafer 26.

Figure 5:
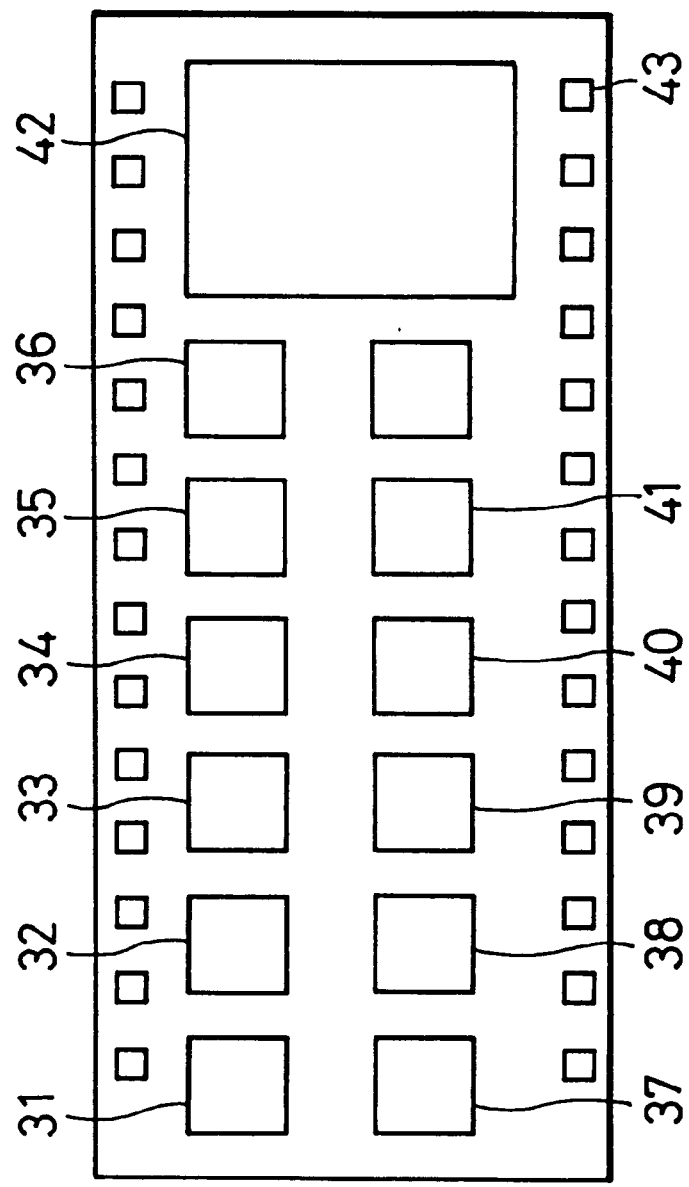
FIG. 5 is a schematic view illustrating the arrangement of the silicon tester.

FIG. 5 shows an example of the arrangement of the silicon tester wafer 24. The silicon tester wafer 24 receiver one bit data, and outputs test results in number equal to the number of memories to be tested. The silicon tester wafer 24 comprises a multi chip/bit control circuit 31, a block selection decoder 32, a chip selection decoder 33, a control circuit 34 for multiplying clock frequency by P times, a P times multiplying algorithm circuit 35, a circuit 36 for protection from self-excess current, a position alignment circuit 37, a circuit 38 for carrying out an 20 in-chip test, a fail memory circuit 39, a current control circuit 40, a comparator circuit 41, an on-chip capacitor 42, and a plurality of pads 43.

The multi chip/bit control circuit 31 produces N bit data for each of M chips on the basis of 1 bit data for a chip supplied from the memory tester 21 by using a decoder circuit and an exclusive OR circuit for input/outputs and addresses. Herein, N and M are positive integers.

The block selection decoder 32 divides a wafer to be tested into A blocks and selects one of the thus divided blocks for testing, when the silicon tester wafer 24 is to test the wafer 26. Herein, A is a positive integer.

The chip selection decoder 33 selects one of the chips formed on a wafer to be tested when the silicon tester wafer 24 is to test the wafer 26.

The P times multiplying control circuit 34 multiplies a clock frequency supplied from the memory tester 21 by P times means of phase-synchronous loop. Herein, P is a positive integer equal to or greater than 2.

The P times multiplying algorithm circuit 35 produces test patterns by means of an up/down counter and a latch circuit, which test patterns are not supplied from the memory tester, at the second cycle or later than the second cycle in the P times multiplying operation to be carried out by the circuit 35, when the P times multiplying control circuit 34 operates.

The circuit 36 for protection from self-excess current uses a flip-flop circuit having reset functions to thereby stop supplying a current to a chip through which an excess current over a rated current is running.

The position alignment circuit 37 supplies a dc current to B pads disposed in relation to certain pads of the chip to be tested from the memory tester 21 through a signal switching circuit in order to align the pads 43 of the silicon tester wafer 24 to pads of the chip to be tested.

The circuit 38 for carrying out an in-chip test has therein, a dummy chip circuit having a function or functions corresponding to a part of the functions of the chip to be tested. The circuit 38 tests the dummy chip circuit to thereby self-diagnose the operation of the memory tester 21.

The fail memory circuit 39 stores therein test results for a chip by means of a flip-flop circuit when the chip was tested and found to be defective.

The current control circuit 40 controls a current, when a plurality of chips formed on a wafer to be tested are tested in parallel, either by dividing a clock frequency supplied from the memory tester 21 to 1/C by means. of a frequency division circuit or dividing a wafer to be tested into several blocks and then selecting one of the blocks in turn. Herein, C is a positive integer equal to or greater than 2.

The comparator circuit 41 evaluates test results of the tested chips. The on-chip capacitor 42 operates as a bypass capacitor between the silicon tester wafer 24 and the wafer to be tested.

It is not always necessary to provide all of the above mentioned elements 31 to 42 with the silicon tester wafer 24. For instance, when an individual chip is to be tested, some of the elements 31 to 42 can be omitted.

Figure 6:
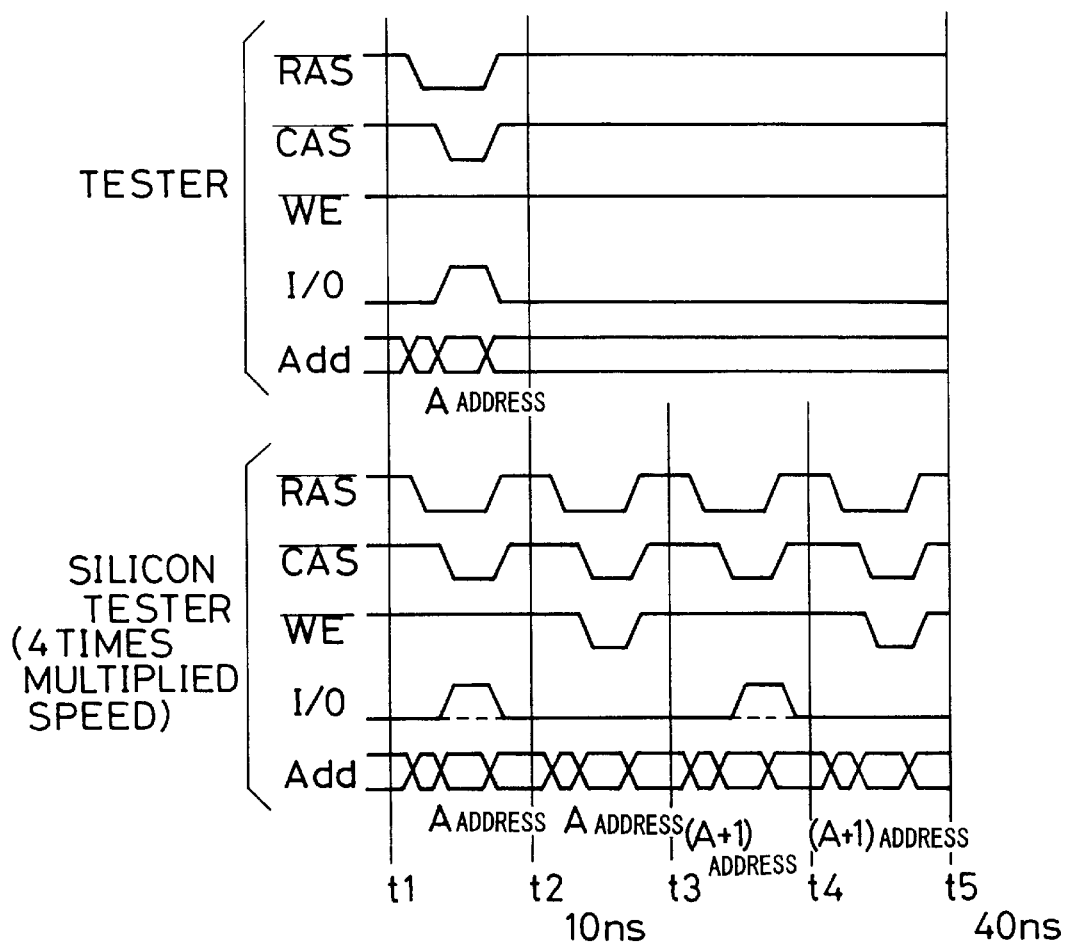
FIG. 6 is a timing chart showing the operation of the silicon tester.

FIG. 6 is a timing chart of the operation of the silicon tester wafer 24 illustrated in FIG. 5. When each of the signals is set during 10 nanoseconds ranging from $t_1$ to $t_2$ among a test period of 40 nanoseconds ranging from $t_1$ to $t_5$ which is supplied from the memory tester 21, the P times multiplying control circuit 34 and the P times multiplying algorithm circuit 35 copy waveforms present in the range of t1 to t2 by means of a phase-synchronous loop, an up/down counter and a latch circuit, and then output the thus copied waveforms in each of periods of time between $t_2$ and $t_3$, $t_3$ and $t_4$, and $t_4$ and $t_5$. The period ranging from $t_1$ to $t_2$ is a lead H of an increment of marking, the period ranging from $t_2$ to $t_3$ is a light L, the period ranging from $t_3$ to $t_4$ is a lead H of address (A+1), and the period ranging from $t_4$ to $t_5$ is a light L of address (A+1). The change between L level and H level in each signal and the change in address are carried out by the P times multiplying algorithm circuit 35. The change of the transition time from H level to L level or from L level to H level in each signal is carried out by the P times multiplying control circuit 34.

The silicon tester illustrated in FIGS. 5 and 6 is for testing a wafer, but it should be noted that the silicon tester can be modified to test an individual chip. Hereinbelow is explained the operation of the first embodiment in which the silicon tester is used for testing an individual chip.

First, it is assumed that the chip 16 to be tested is a non-defective 16M-DRAM chip. The silicon tester chip 14 supplies the chip 16 to be tested with signals for testing through the piezoelectric conductive rubber 15. The outputs of the chip 16 are transmitted to the silicon tester chip 14 through the piezoelectric conductive rubber 15. Based on the outputs from the chip 16, the comparator circuit 41 formed in the silicon tester chip 14 determines the chip 16 to be non-defective. The determination is transmitted to the memory tester 11 through the signal line cable 12.

When the chip 16 to be tested is a 16M-DRAM chip which is defective in marking, signals for testing are also supplied to the chip 16 from the silicon tester chip 14 through the electrically conductive rubber 15, similarly to the above mentioned case. Then, the outputs of the chip 16 are transmitted to the silicon tester chip 14 through the piezoelectric conductive rubber 15. The comparator circuit 41 formed in the silicon tester chip 14 determines the chip 16 to be defective, because the comparator circuit 41 receives an L level output although an H level output is expected. Thus, a signal representing that the chip 16 is defective is transmitted from the silicon tester chip 14 to the memory tester 11 through the signal line cable 12. In addition, the test result representing that the chip 16 is defective is stored in the fail memory circuit 39 formed in the silicon tester chip 14.

If there is a defect that causes an excess current to run through the chip 16 to be tested during standby, the circuit 36 for protection from self-excess current starts to operate at the time when a voltage is applied to that chip 16. Thus, application of current to the chip 16 to be tested is ceased, and in addition, information that the chip 16 is defective is transmitted to the memory tester 11.

Hereinbelow the operation of the second embodiment will be described. In the second embodiment, the number of chips to be tested is not one, as in the first embodiment. A number of the chips formed on the wafer 26 are tested. For instance, if the wafer 26 has 96 chips formed thereon, 16 chips are tested. Fundamental operation of the second embodiment is the same as that of the first embodiment, and hence hereinbelow only the difference between them is described.

With reference to FIG. 4, the memory tester 21 supplies 1 bit data of one chip to the silicon tester wafer 24. The multi chip/bit control circuit 31 formed in the silicon tester wafer 24 produces 8 bit data of 16 chips by means of a latch circuit and an exclusive OR circuit built therein. The block selection decoder 32 divides the 96 chips into 6 blocks, and then selects one of the blocks which has 16 chips therein. Then, the signals of 8 bit data are transmitted to the thus selected block.

In the above mentioned embodiments, an integrated circuit to be tested is exemplified as a DRAM chip or a wafer on which a plurality of DRAM chips are formed. However, it should be noted that the tester in accordance with the present invention can be applied to other types of integrated circuits.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A tester for integrated circuits, comprising:
   (a) a testing set for supplying inputs to an integrated circuit under test for operation thereof and for measuring outputs of said integrated circuit under test; and
   (b) a semiconductor chip or wafer having at least one testing function for testing said integrated circuit under test; and
   (c) a contact member though which said semiconductor chip or wafer is to come to electrical contact with said integrated circuit under test;
   wherein said contact member is made of piezoelectric conductive rubber (PCR).

2. A tester for integrated circuits, comprising:
   (a) a testing set for supplying inputs to an integrated circuit under test for operation thereof and for measuring outputs of said integrated circuit under test; and
   (b) a semiconductor chip or wafer arranged to be in direct contact with said integrated circuit under test, said semiconductor chip or wafer having at least one testing function for testing said integrated circuit under test;
   wherein said integrated circuit under test is made up of a single wafer having a plurality of chips thereon, and wherein said semiconductor wafer is provided with means for producing N bit data for each of M chips based on 1 bit data for one of said chips formed on said wafer wherein N and M are positive integers.

3. A tester for integrated circuits, comprising:
   (a) a testing set for supplying inputs to an integrated circuit under test for operation thereof and for measuring outputs of said integrated circuit under test; and
   (b) a semiconductor chip or wafer arranged to be in direct contact with said integrated circuit under test, said semiconductor chip or wafer having at least one testing function for testing said integrated circuit under test;
   wherein said semiconductor wafer is provided with means for dividing said integrated circuits formed on said wafer into A blocks wherein A is a positive integer, and selecting one of said blocks and testing the thus selected block.

4. A tester for integrated circuits, comprising:
   (a) a testing set for supplying inputs to an integrated circuit under test for operation thereof and for measuring outputs of said integrated circuit under test; and
   (b) a semiconductor chip or wafer arranged to be in direct contact with said integrated circuit under test, said semiconductor chip or wafer having at least one testing function for testing said integrated circuit under test;
   wherein said integrated circuit under test is made up of a single wafer having a plurality of chips thereon, and wherein said semiconductor wafer is provided with means for selecting one of said chips of said integrated circuit under test and testing the thus selected chip.

5. A tester for integrated circuits, comprising:
   (a) a testing set for supplying inputs to an integrated circuit under test for operation thereof and for measuring outputs of said integrated circuit under test; and
   (b) a semiconductor chip or wafer arranged to be in direct contact with said integrated circuit under test, said semiconductor chip or wafer having at least one testing function for testing said integrated circuit under test;
   wherein said semiconductor chip or wafer is provided with means for multiplying by P times a clock frequency supplied from said testing set, wherein P is a positive integer equal to or greater than 2.

6. The tester for integrated circuits as set forth in claim 5, wherein said semiconductor chip or wafer is provided with means for producing test patterns at the second cycle or later than the second cycle in P times multiplying operation to be carried out by said P times multiplying means, said test patterns being patterns not supplied from said testing set.

7. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for stopping supplying a current to a circuit through which an excess current exceeding a rated current is running.

8. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with at least one pad disposed correspondingly to a pad disposed on said integrated circuit under test, said pad of said semiconductor chip or wafer having means for receiving dc signals from said testing set for testing said integrated circuit under test.

9. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for self-diagnosing.

10. The tester for integrated circuits as set forth in claim 9, wherein said means for self-diagnosing includes therein a dummy chip circuit having same functions of said integrated circuit under test.

11. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for storing therein test results for said integrated circuit under test when said integrated circuit was tested and found to be defective.

12. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for controlling a current by retarding a clock frequency supplied from said testing set when a plurality of chips of said integrated circuit under test are to be tested in parallel.

13. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for controlling a current, when a plurality of chips of said integrated circuit under test are to be tested, by dividing said integrated circuits under test into a plurality of blocks and selecting said blocks one by one in turn.

14. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with means for evaluating test results of said integrated circuit.

15. A tester for integrated circuits, comprising:

(a) a testing set for supplying inputs to an integrated circuit under test for operation thereof and for measuring outputs of said integrated circuit under test; and (b) a semiconductor chip or wafer arranged to be in direct contact with said integrated circuit under test, said semiconductor chip or wafer having at least one testing function for testing said integrated circuit under test;

wherein said semiconductor chip or wafer is provided with an on-chip capacitor serving as a bypass capacitor between said semiconductor chip or wafer and said integrated circuit under test.

* * * * *